United States Patent
Sakai et al.

[19]

[11] Patent Number: 6,057,636

[45] Date of Patent: May 2, 2000

[54] MICRO POWER SWITCH USING A COLD CATHODE AND A DRIVING METHOD THEREOF

[75] Inventors: Tadashi Sakai; Tomio Ono; Naoshi Sakuma; Hiromichi Ohashi, all of Yokohama; Kazuya Nakayama, Sagamihara, all of Japan

[73] Assignee: Kabushiki Kaisha Toshiba, Kawasaki, Japan

[21] Appl. No.: 08/931,417

[22] Filed: Sep. 16, 1997

[30] Foreign Application Priority Data

Sep. 17, 1996 [JP] Japan .................................. 8-245318
Sep. 1, 1997 [JP] Japan .................................. 9-236046

[51] Int. Cl.[7] .............................. H01J 1/46; H01J 21/10; H01J 1/02; H01J 1/05

[52] U.S. Cl. .......................... 313/306; 313/309; 313/336; 313/351; 313/495; 313/307; 313/308; 313/311

[58] Field of Search .............................. 313/309–11, 351, 313/336, 346 R, 495–97, 306, 307, 308; 345/55, 74–75, 80

[56] References Cited

U.S. PATENT DOCUMENTS

| | | | |
|---|---|---|---|
| 5,038,070 | 8/1991 | Bardai et al. ............................ | 313/309 |
| 5,188,977 | 2/1993 | Stengl et al. ......................... | 313/309 X |
| 5,319,233 | 6/1994 | Kane .................... | 313/309 X |
| 5,319,279 | 6/1994 | Watanabe et al. ................... | 313/309 X |
| 5,541,473 | 7/1996 | Duboc, Jr. et al. .................. | 313/495 X |
| 5,644,156 | 7/1997 | Suzuki et al. . | |
| 5,659,224 | 8/1997 | Kumar et al. .................... | 313/346 R X |
| 5,723,867 | 3/1998 | Imura .................................. | 313/309 X |
| 5,796,211 | 8/1998 | Graebner et al. ................... | 313/311 X |
| 5,834,790 | 11/1998 | Suzuki et al. ....................... | 313/309 X |

FOREIGN PATENT DOCUMENTS 0 639 847  2/1995  European Pat. Off. .

OTHER PUBLICATIONS

Heinz H. Busta, et al., "Collector–Induced Field Emission Triode", IEEE Transactions on electron devices, vol. 39, No. 11, Nov. (1992), pp. 2616–2620.

*Primary Examiner*—Nimeshkumar D. Patel
*Assistant Examiner*—Mack Haynes
*Attorney, Agent, or Firm*—Oblon, Spivak, McClelland, Maier & Neustadt, P.C.

[57] ABSTRACT

The present invention provides a micro power switch comprising a cold cathode for emitting electrons, an anode for capturing the electrons emitted from the cold cathode, and a control electrode for controlling an amount of the electrons emitted from the cold cathode, wherein the cold cathode is made of material having a smaller electron emission barrier than the control electrode, the anode is applied with a positive potential in relation to the cold cathode, and the control electrode is applied with a potential equal to or lower than a potential of the cold cathode.

30 Claims, 6 Drawing Sheets

MICRO POWER SWITCH USING A COLD CATHODE AND A DRIVING METHOD THEREOF

BACKGROUND OF THE INVENTION

The present invention relates to a power switch having an electron emission type cold cathode.

The present invention also relates to a driving method of this kind of power switch.

In recent years, an electric field emission type cold cathode has greatly attracted attention because of its possibility to realize a high-speed response, its radiation resistance, and its possibility to accept a large current. Therefore, many developments have been made to this kind of cold cathode.

Those developments began with a proposal for a tunnel effect vacuum triode proposed by K. R. Shoulders in 1961 (ref. Microelectronics using electron-beam-activated machining techniques, Advances in Computers Vol. 1, p.p. 135 to 293).

In general, this field began to attract attention since a report prepared by SRI (Stanford Research Institute), which concerns a cold cathode ray tube using a thin film by C. A. Spindt (ref. Appl. Phys. 39, p. 3504, 1968).

This report discloses a method called a Spindt method for preparing a device and basis of its structure, with use of an oblique rotating evaporation method and a skilled means adopting sacrifice layer etching. The Spindt method is most widely used now. The device will be schematically explained with reference to FIGS. 1 to 3 showing a representative prior art example.

Figure 1:
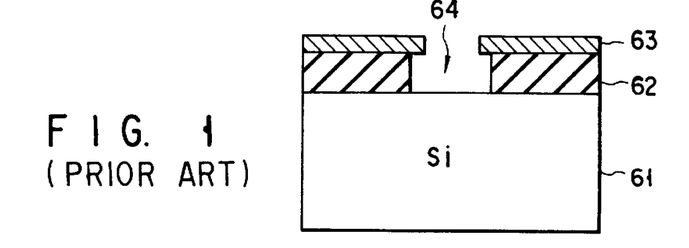
FIG. 1 is a view showing a manufacturing step of a conventional cold cathode ray tube.

At first, as shown in FIG. 1, a thermal oxide film 62 is formed on an Si substrate 61, and for example, an Mo metal layer 63 as a metal layer for forming a control electrode is formed on the film 62. Further, the Mo metal layer 63 is subjected to patterning to form a control electrode opening portion 64, and thereafter, the thermal oxide film 62 is selectively etched.

Figure 2:
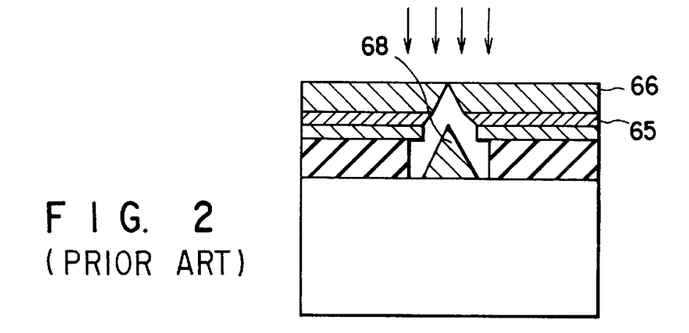
FIG. 2 is a view showing a manufacturing step of a conventional cold cathode ray tube.

Subsequently, as shown in FIG. 2, for example, an Al metal layer 65 is evaporated thinly as metal forming a sacrifice layer, and thereafter, for example, an Mo metal layer 66 as metal for forming a cold cathode is evaporated and formed by a oblique rotating evaporation method. Since evaporated metal sticks to the periphery of an opening portion, the opening portion is gradually reduced, and an Mo cold cathode 68 having a tapered tip like a cone is formed in the opening portion.

Figure 3:
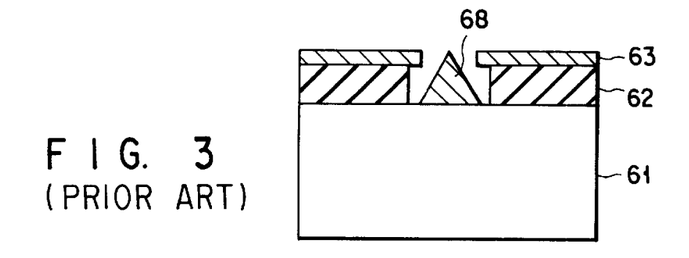
FIG. 3 is a view showing a manufacturing step of a conventional cold cathode ray tube.

At last, as shown in FIG. 3, an excessive portion of the Mo metal layer 66 sticking to the control electrode 63 is removed together with the Al metal layer 65 as a sacrifice layer, and thus, a cold cathode ray tube is completed.

There are some other proposals than those described above, with respect to various specific structures. The basis of the element, however, is constructed by a cold cathode tapered end which easily generates electric field concentration, a control electrode provided in the vicinity of the cold cathode, and an electron capture electrode (anode) which receives electrons emitted.

Normally, a positive voltage is applied to the control electrode provided in the vicinity of the cold cathode, and a strong electric field of $10^{-7}$ V/cm or more is applied to the end of the cold cathode by a proximity effect and an electric field concentration effect at the end of the cold cathode. Further, electrons are emitted from the tapered end by a tunnel effect.

Emitted electrons are attracted to an anode by a positive voltage applied to the anode formed at a position opposite to the cold cathode, and a current flows between the cold cathode and the anode.

Figure 4:
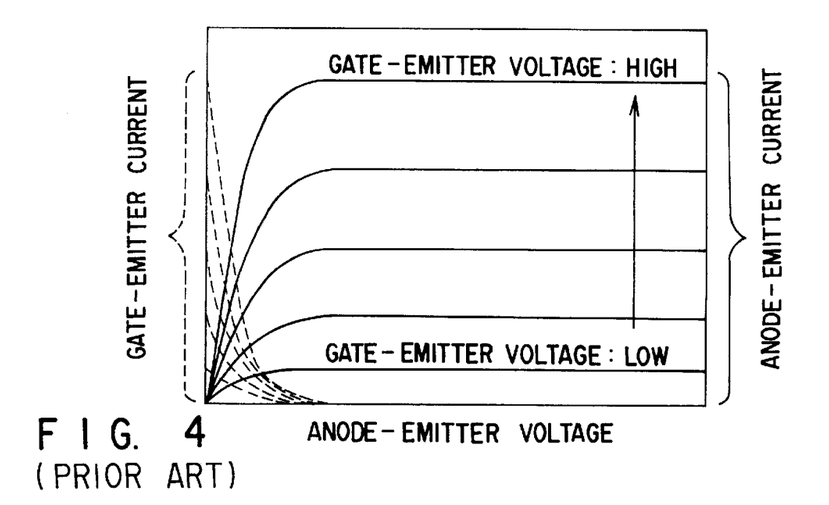
FIG. 4 is a graph showing current-voltage characteristics of a conventional cold cathode ray tube.

The current voltage characteristic of the element is schematically shown in FIG. 4. Here, it is important that the emission current from the cold cathode is determined by a voltage (which will hereinafter be simply called a control electrode voltage) applied between the control electrode and the cold cathode, and further, the amount of electrons which reach the anode among the emitted electrons changes, depending on the voltage (which will hereinafter be called an anode voltage) between the anode and the cold cathode.

This means, while a certain constant control electrode voltage is applied, the total number of electrons emitted from the cold cathode is constant, and all the electrons reach the anode only at the region where the anode voltage is sufficiently large, and the constant current value is attained. Suppose that this region is called a saturated region. In the saturated region, the current value increases and decreases only in accordance with the control electrode voltage.

Meanwhile, when the anode voltage decreases, the anode current decreases in accordance with a decreases in the anode voltage. This characteristic may seem to be just the static characteristic of an MOSFET. However, in case of a cold cathode ray tube, it should be noted that the number of electrons emitted from the cold cathode is not changed in this region, and excessive residual electrons flow to the control electrode as the anode current decreases. Broken lines in the figure are control electrode current values under conditions of respective control electrode voltages, the sum of the control electrode current and the anode current is substantially constant with respect to the control electrode voltage.

This kind of characteristic inherent to a conventional cold cathode ray tube does not cause problems with respect to such a use in which only the current to the anode is modified in case of a display, but causes a significant problem in case where the cold cathode ray tube is used as a switching element.

Specifically, where the cold cathode ray tube is to be used in a switching circuit which is applied to power device used for GTO,IGBT, etc., an element should originally have a characteristic of a simple switch, i.e., it is ideal that the element does not allow a current to flow even if a high voltage is applied while the switch is shut off, but the element allows a current to flow with an infinitesimal resistance drop in accordance with a voltage applied to the element from an external circuit.

This means, it is preferable that a current flows like a simple cable in accordance with Ohm's law and the internal resistance is as small as possible while the current capacity is as large as possible.

In case of a conventional cold cathode ray tube, however, as has been described above, the current value is essentially determined by a control electrode voltage applied. Specifically, in a saturated region, only a constant anode current flows through an element even when a voltage of an external circuit is changed, so that the element appears to behave like a current equalizer circuit having a variable internal resistance.

Meanwhile, in a non-saturated region, the anode current changes, depending on the voltage applied from an external circuit. Hence, the conventional cold cathode ray tube can be used as a switching element. However, the efficiency with which a current is used is extremely degraded since an excessive residual current flows through the control electrode.

For example, in the center of the non-saturated region, an half of all the electrons emitted from a cold cathode flows through the anode to the main circuit, and the power loss is 50% and is thus very large. Switching means control of transmission of an energy, itself, and it is a requisite that the element can be switched on and off with a low power loss.

As has been explained above, if a conventional cold cathode ray tube is regarded as a switching element, the cold cathode ray tube causes a problem that a constant current is caused with a control electrode voltage without depending on the voltage applied from an external circuit or a problem that only a low efficiency is attained due to a loss current to the control electrode. It is thus difficult to use a conventional cold cathode ray tube as a switching element.

BRIEF SUMMARY OF THE INVENTION

The present invention has been made in view of the above situation, and has an object of providing a micro power switch which is used as a switching element inducing only a low loss, which is capable of allowing a necessary current to flow in accordance with an external voltage applied to a main circuit connected to an anode, which attains a high withstanding voltage, and which is capable of generating a large current.

In addition, the present invention has an object of providing a driving method for a micro power switch as described above.

In order to achieve the above objects, a micro power switch according to a first aspect of the present invention comprises: a cold cathode for emitting electrons; an anode for capturing the electrons emitted from the cold cathode; and a control electrode for controlling an amount of the electrons emitted from the cold cathode, wherein the cold cathode is made of material having a smaller electron emission barrier than the control electrode, the anode is applied with a positive potential in relation to the cold cathode, and the control electrode is applied with a potential equal to or lower than a potential of the cold cathode, in case where the electron emission from the cold cathode is stopped.

In addition, according to a second aspect of the present invention, the micro power switch according to the first aspect further comprises an insulating layer provided between the anode and the control electrode, wherein a distance between the control electrode and the anode on the cold cathode is shorter than a distance between the anode and the control electrode of the insulating layer.

Further, according to a third aspect of the present invention, the micro power switch according to the first aspect further comprises an inducing electrode provided between the control electrode and the anode and applied with a positive potential in relation to the cold cathode.

Further, according to a fourth aspect of the present invention, the micro power switch according to the third aspect further comprises an intermediate electrode provided between the inducing electrode and the anode and applied with a positive potential in relation to the anode.

Further, according to a fifth aspect of the present invention, a driving method for a micro power switch comprising a cold cathode for emitting electrons, an anode for capturing the electrons emitted from the cold cathode, and a control electrode for controlling an amount of the electrons emitted from the cold cathode, wherein the cold cathode is made of material having a smaller electron emission barrier than the control electrode, comprises steps of: applying, to the anode, a potential necessary for drawing the electrons from the cold cathode; and applying, to the control electrode, a potential equal to or lower than a potential of the cold cathode in order to prevent the electrons from being emitted from the cold cathode.

Further, according to a sixth aspect of the present invention, a driving method for a micro power switch comprising a cold cathode for emitting electrons, an anode for capturing the electrons emitted from the cold cathode, a control electrode for controlling an amount of the electrons emitted from the cold cathode, and an insulating layer provided between the anode and the control electrode, wherein the cold cathode is made of material having a smaller electron emission barrier than the control electrode, and a distance between the control electrode and the anode on the cold cathode is shorter than a distance between the anode and the control electrode of the insulating layer, comprises steps of: applying, to the anode, a potential necessary for drawing the electrons from the cold cathode; and applying, to the control electrode, a potential equal to or lower than a potential of the cold cathode in order to prevent the electrons from being emitted from the cold cathode.

Further, according to a seventh aspect of the present invention, a driving method for a micro power switch comprising a cold cathode for emitting electrons, an anode for capturing the electrons emitted from the cold cathode, an inducing electrode provided between the control electrode and the anode and applied with a positive potential in relation to the cold cathode, an intermediate electrode provided between the inducing electrode and the anode and applied with a positive potential in relation to the anode, and a control electrode for controlling an amount of the electrons emitted from the cold cathode, wherein the cold cathode is made of material having a smaller electron emission barrier than the control electrode, comprises steps of: applying, to the anode, a potential necessary for drawing the electrons from the cold cathode; and applying, to the control electrode, a potential equal to or lower than a potential of the cold cathode in order to prevent the electrons from being emitted from the cold cathode.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

At first, preferred embodiments of the present invention will be described as follows.

(1) The cold cathode is made of material having an electron emission barrier smaller than the control electrode.

(2) The control electrode is made of Si, and the cold cathode is made of one of a group of carbon-based material having an $SP^3$ bond (which is particularly diamond or diamond-like carbon), amorphous carbon, carbon-nano tube (where each of the amorphous carbon and carbon-nano tube needs not always contain an $SP^3$ bond), GaN, and BN, or material containing any of the group.

(3) The part of the control electrode surface which is exposed to an electric field from the anode is covered with material such as platinum which has a large work function, and the shape of the surface of the control electrode is smoothened in order to restrict electron emission at the control electrode surface by the electric field.

(4) The part of the control electrode surface which is exposed to an electric field from the anode is covered with an insulting layer which serves as an electron emission barrier.

(5) The insulating layer covering the control electrode surface is made of $Al_2O_3$, $MgF_2$, $SiO_2$, or $TiO_2$.

(6) A dielectric layer is inserted between the inducing electrode and the anode, and the minimum distance between the anode and the inducing electrode on the cold cathode is set to be smaller than the thickness of the inducing layer.

(7) The inducing electrode is formed like a grid.

(8) An intermediate electrode is provided between the anode and the inducing electrode.

(9) a potential between the anode and the cold cathode when the micro power switch is rendered electrically conductive is ½ or less of a potential between the anode and the cold cathode when the micro power switch is shut off.

Thus, according to the present invention, the control electrode is not applied with a positive voltage, but a negative or an equal potential is applied to the cold cathode. Therefore, all the electrons emitted from the cold cathode in accordance with an anode voltage flow to the anode.

As a result, it is possible to realize the basic characteristic of a switching element which increases and decreases a current in accordance with a main circuit voltage. Although there have been a developmental example of a cold cathode of an anode lead type, those examples require a very high lead voltage, so that a voltage of several hundreds V is normally required between an anode and a cathode in order to actually make a current flow.

In this case, such an example used as a switching circuit causes a power loss of (a main circuit current ×a voltage between an anode and a cathode), and thus achieves a very low efficiency.

In the present invention, to avoid such a result, the threshold voltage of the rising current is greatly reduced by using diamond or the like, which has a very low electron affinity or a negative electron affinity, as cold cathode material.

For example, where the threshold voltage of the element is set to 3 V, the distance between an anode and a cold cathode can be enlarged up to 10 μm with a planar material by using a low resistance diamond thin film which induces electron emission by an electric field of 0.3 V/μm.

Further, if the top end of the cold cathode is sharpened and a level of an electric field concentration coefficient β=100 which can normally be attained is realized, the distance between the anode and the cold cathode can be enlarged up to 1 mm. However, in this case, although it is possible to make a desired current flow with respect to a main circuit voltage, the switch cannot turned off.

According to the present invention, this problem is solved in a manner in which an anode electric field is shut off thereby to stop emission of electrons, by providing a control electrode for shutting off the electric field and by applying a negative potential or a zero potential to the cold cathode, on the contrary to normal cases. A control electrode is normally provided in the vicinity of a cold cathode, and serves to apply a positive potential to a cold cathode thereby to draw those electrons which will otherwise be not emitted.

In contrast, the control electrode according to the present invention just serves to stop electrons which are kept emitted from an anode electric field, and is characterized in that the direction of the potential is set to be negative or equal with respect to the cold cathode, on the contrary to the prior art.

In case where the structure described above is adopted, there is an anxiety about actual use of the structure. The anxiety is to maintain a withstanding voltage between the anode and the control electrode. There are various factors which cause insulating break-down between electrodes in a vacuum, and there is few firm opinions about the factors.

However, several literatures teach an opinion that insulating break-down in a gap of a size of 1 mm or less which is dealt with in the present invention is substantially decided by electric field emission, and the same opinion has been obtained from the experiments made by the present inventors.

Specifically, it is considered that electrons jump into a vacuum from the surface of material, based on the same principle as that of electron emission from a cold cathode, and the electrons serve as carriers which generates a flow of electrons.

From the view point of this opinion, since the control electrode is applied with a potential substantially equal to or lower than that of the cold cathode, a stronger electric field is applied between the anode and the control electrode than between the anode and the cold cathode.

Suppose that the material of the cold cathode and the material of the control electrode have substantially equal electron emission barriers like in a conventional element. In this case, even though emission of electrons from the cold cathode can be stopped, electrons are emitted through a slight projection if there is any slight projection on the surface of the control electrode. As a result, anode current flows due to leakage between the anode and the control electrode.

Definition concerning the material of a control electrode and the structure as a requisite of the present invention is aimed to lighten the problem described above and to maintain an insulating with-standing voltage. As a result of this, a with-standing voltage of about 10 kV can be obtained with use of normal material in case where the threshold voltage described above is 3 V. A much higher with-standing voltage can be obtained by using high work function material such as Pt or the like for the control electrode with respect to a cold cathode made of diamond or the like.

In addition, since insulating break-down is caused from an electric field of $10^6$ to $10^7$ V/cm at a portion between an anode and a control electrode inserted between insulating spacers, leakage can occur through insulation even if countermeasures as described above are taken.

Definition concerning insulating spacer layers according to the present invention is aimed to an effect of lightening break-down through the insulating film. Specifically, by pushing out an anode electrode toward a control electrode and a cold cathode, a spacer layer can be arranged to be larger than the distance between the electrodes, so that the electric field in the insulating material can be reduced thereby preventing insulating break-down.

Further, by coating material as an electron emission barrier over the surface of the control electrode exposed to the anode electric field, electrons can be prevented from being emitted from the control electrode and leakage therebetween can be prevented.

In addition, according to the present invention, since an inducing electrode is provided in addition to the structure described above and a positive potential is applied to the inducing electrode with respect to the cold cathode, the anode voltage at which a current starts flowing can be reduced and an ON-voltage can be lowered.

Here, when a current flows through the inducing electrode, the basic characteristic of a switching element that a current increases and decreases in accordance with the main circuit voltage cannot be realized. However, by setting the anode voltage to be sufficiently larger than the inducing electrode voltage, the inducing electrode current can be substantially reduced to zero.

This is based on the same principle as that basing the relationship between a conventional control electrode and a anode voltage as shown in FIG. 4, i.e., the inducing electrode current can substantially reduced to zero by sufficiently enlarging the anode voltage even if the control electrode voltage is positive.

In the following, embodiments of the present invention will be explained with reference to the drawings.
(First Embodiment)

Figure 5:
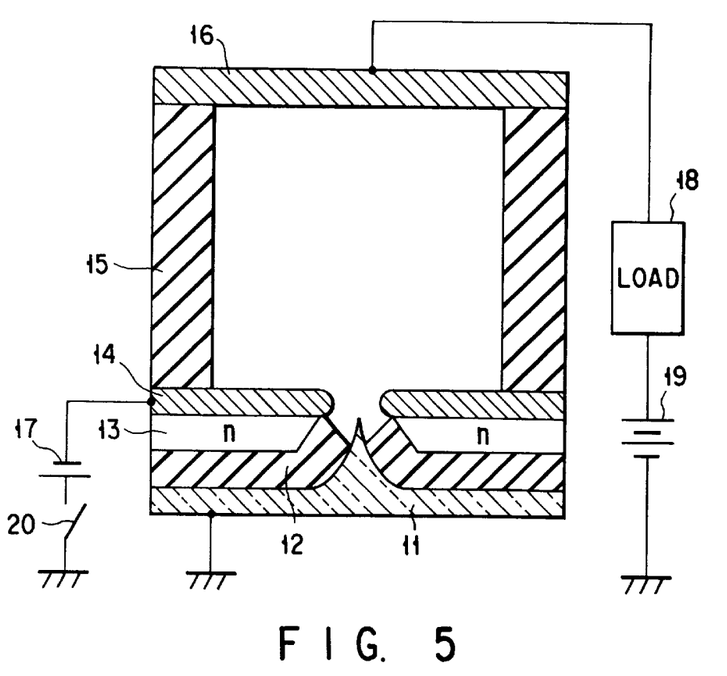
FIG. 5 is a view showing an element structure and a driving circuit of a micro power switch according to a first embodiment of the present invention.

FIG. 5 shows an element structure and a driving circuit of a micro power switch according to a first embodiment of the present invention.

In this figure, a reference 11 denotes a cold cathode (or an emitter) having a projecting portion like a cone or a quadrangular pyramid, and this cold cathode 11 is formed of a diamond thin film. The projecting portion of the cold cathode is formed such that the side surface of this portion is bent and the top end is sharpened. An Si control electrode 13 is formed on the surface of the cold cathode 11, with an oxide film 12 interposed therebetween, except for an end of the projecting portion.

A platinum control electrode 14 is formed on an upper surface portion of the Si control electrode 13.

An anode 16 as an electron capture electrode made of Mo is provided above the control electrodes (or gates) 13 and 14, such that the anode 16 is opposed to the control electrodes 13 and 14 with a distance inserted between the anode 16 and the electrodes 13 and 14. An insulating spacer layer 15 made of quartz glass is inserted between the anode 16 made of Mo and the platinum control electrode 14.

In a cold cathode ray tube thus constructed, the control electrodes 13 and 14 are connected with a control-electrode-cold-cathode power source 17. An end of the control-electrode-cold -cathode power source 17 is grounded through a switch 20.

The anode 16 is connected with a main circuit load 18 and a main circuit power source 19. The diamond cold cathode 11 is connected to a common earth for the power sources 17 and 19. Here, the polarities of the power sources 17 and 19 are shown in the figure, and the control electrodes 13 and 14 are applied with a negative voltage while the anode 16 is applied with a positive voltage.

Figure 6:
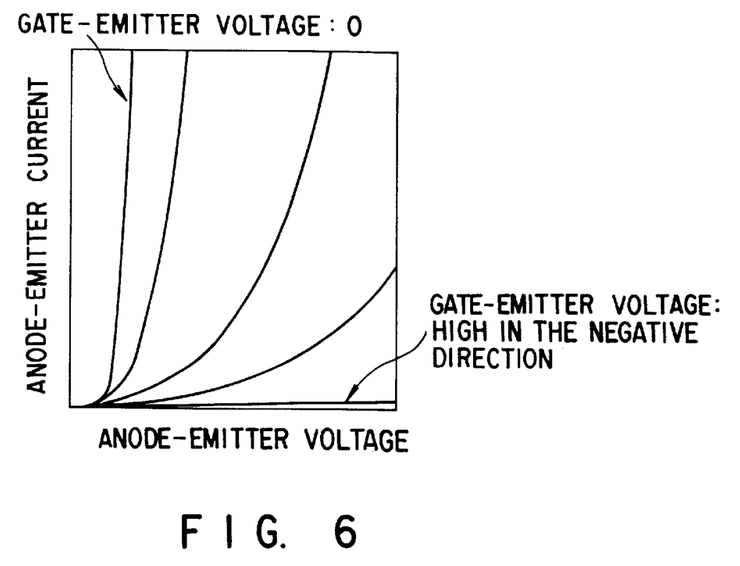
FIG. 6 is a graph showing current-voltage characteristics of a micro power switch according to the first embodiment.

The operation characteristics of the element when the cathode is driven with a connection as described above are shown in FIG. 6. FIG. 6 is a current-voltage characteristic graph showing changes in the current between the anode and the emitter with respect to the voltage between the anode and the emitter in the element according to this embodiment.

As shown in this figure, when a voltage is applied between the anode and cathode without applying a voltage to the control electrode, at first, a current rapidly flows from the anode as the applied voltage increases. Meanwhile, when a negative voltage is applied to the control electrode, the current decreases as the voltage increases in the negative direction, and at last, no current flows.

In case where the element is used as a switching element, a voltage is not applied to the control electrode when the circuit is turned on, but a negative voltage is applied when the circuit is turned off.

Suppose that the electron emission threshold electric field of the diamond thin film currently used is $E_{th}(dia)$ (V/$\mu$m), the electric field concentration coefficient when the diamond thin film is formed as a sharp emitter is $\beta$, and the electron emission threshold voltage required for the element is $V_{th}$ (V). Then, the maximum distance $d_{AE}$ ($\mu$m) between the emitter and the anode can be evaluated as follows.

$$d_{AE} - V_{th} (\beta/V_0)$$

Here, where $V_0 = 0.3$ V/$\mu$m, $V_{th} = 3$ V, and $\beta = 100$ are satisfied, $d_{AE} = 1000$ $\mu$m.

In this state, the element withstanding voltage is decided by an insulating break-down between the gate and the anode, which prevents electrons from being emitted from the emitter by a negative voltage applied. It is said that the limit of the insulating break-down is substantially determined by an electric field emission in case of a narrow vacuum gap of 1 mm or less like in this embodiment.

Therefore, from the electron emission threshold electric field $E_{th}$ of the gate material, the expected insulating break-down limit voltage $V_{MAX}(V)$ is obtained as follows, in case of the gate-emitter distance $d_{AE}$ described above.

$V_{MAX} = E_{th}/d_{AE}$

Here, $E_{th}$ is approximately $10^6$ V/cm in case of general material like Mo, $V_{MAX}=10000(V)$ is obtained in consideration of a case where $d_{AE}=1000$ μm is satisfied. The withstanding voltage can further be improved by using material like Pt which has a high work function. In addition, a diamond cold cathode is capable of attaining an emission current of $10^{-5}$ (A) per chip, if the voltage increases to be twice or less larger from when emission of electrons is started.

Therefore, in case where convex chips each having a 1.5 μm square size are integrated with spacing of 1.5 μm, $11 \times 10^6$ or more chips can be integrated per 1 cm$^2$, and hence, a current density of 100 A/cm$^2$ or more can be obtained with a voltage loss which is twice larger than $V_{th}$.

Thus, according to this embodiment, since diamond which is material having a low electron affinity is used as cold cathode material, an electron emission barrier can be made of smaller material than in case where a cold cathode is made of control electrode material. Further, by applying negative potential to the control electrode with respect to a cold cathode, emission of electrons from the cold cathode can be prevented.

Note that, although not shown in the figures, a switching element for a much larger current can be realized by providing a plurality of cold cathodes on one same substrate, by providing a corresponding control electrode, a corresponding anode, and the like for each of the cold cathodes, and by connecting the cathodes in parallel with each other.

In the next, explanation will be made to a structure and a preparation process of the micro power switch according to the present embodiment. In order to control the shape of diamond and to form a precise electrode, this embodiment adopts a preparation method based on a transfer mold method which has been proposed by the present inventors.

Figure 7A:
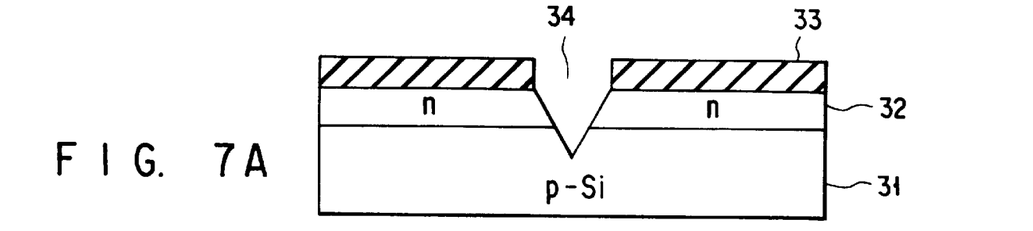
FIG. 7A is a view showing a manufacturing step of a micro power switch according to the first embodiment.

At first, as shown in FIG. 7A, a p-type Si substrate 31 having (100)-azimuth planes as its main surfaces is used to subject phosphor as n-type impurities to implantation (e.g., with an implantation energy of 490 keV and a dose amount of $3 \times 10^{14}$ cm$^{-4}$), so that an n$^+$ layer 32 having a predetermined thickness (e.g., 2 μm) is formed.

Subsequently, an oxide film 33 having an opening is formed on the substrate, and an inverse pyramid type concave portion 34 which forms a mold of a cold cathode is formed by anisotropic etching with the oxide film 33 used as a mask. Here, a casting mold having a depth of 2.8 μm to the top of the pyramid is formed, where the length of each edge of the opening portion of the pyramid is set 4 μm.

Figure 7B:
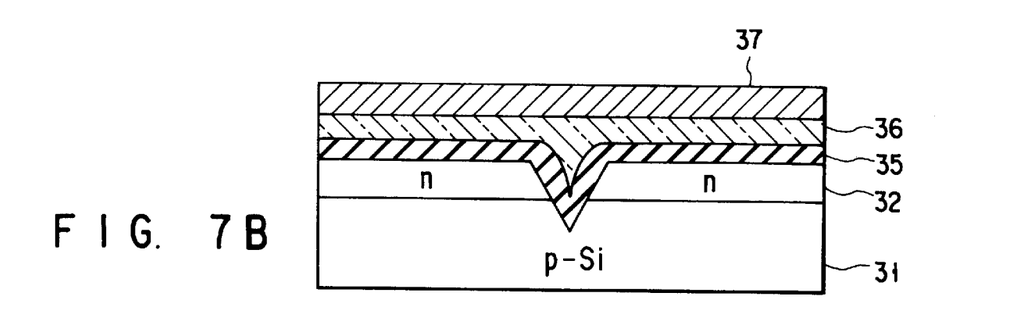
FIG. 7B is a view showing a manufacturing step of a micro power switch according to the first embodiment.

In the next, the mask oxide film 33 is removed, and thereafter, the entire substrate is thermally oxidized, as shown in FIG. 7B, to form a control electrode oxide film 35 (12). For example, an oxide film having a thickness of 0.4 μm is formed by oxidization for 30 minutes in an atmosphere of oxygen and vapor at a temperature of 1100° C. As a result, the inside of the mold is sharpened by growth of the oxide film, so that the electric field concentration coefficient can be improved.

Subsequently, a diamond thin film 36 which forms a diamond cold cathode 11 is filled and formed in the mold. In this case, a diamond thin film having a low resistance doped with nitrogen is obtained by forming a film while applying nitrogen.

In the next, thin films of titanium, copper, and gold are formed, one after another, on the surface of the diamond thin film 36, and an ohmic electrode 37 is formed by performing a heat treatment.

Figure 7C:
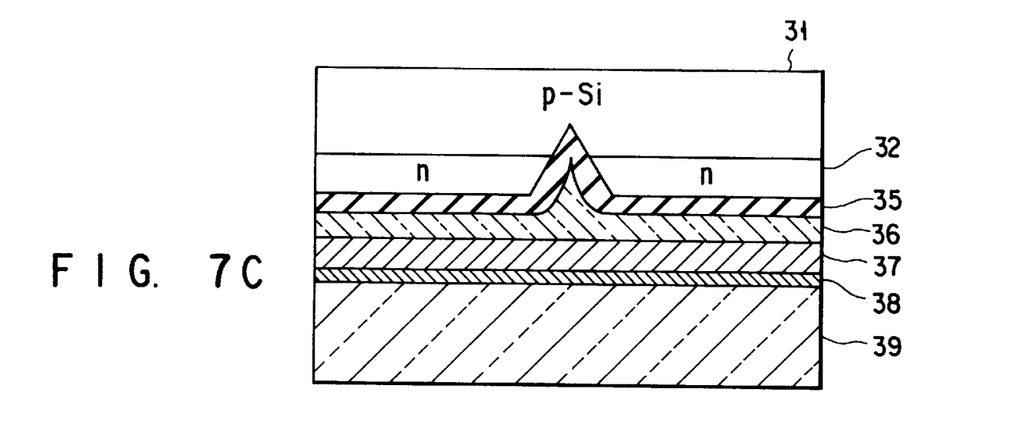
FIG. 7C is a view showing a manufacturing step of a micro power switch according to the first embodiment.

Subsequently, as shown in FIG. 7C, the diamond thin film formation substrate is layered on a glass substrate 39 having a solder-nickel layer film 38 formed on the surface of the glass substrate 39, such that the surface of the diamond thin film formation substrate in the side of the electrode is kept in contact with the glass substrate 39. Then, both substrates are combined together by making a heat treatment.

Figure 7D:
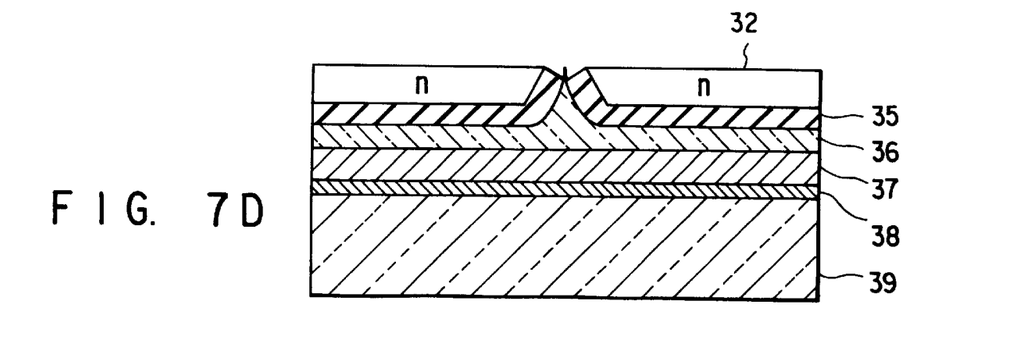
FIG. 7D is a view showing a manufacturing step of a micro power switch according to the first embodiment.

In the next, as shown in FIG. 7D, a p-type Si substrate 31 as a mold is selectively removed by electric chemical etching. In this stage, a lead is extended from an n$^+$ Si layer 32, and an electric potential is applied between the lead and a reference electrode and an opposite electrode provided in a KOH etching solution.

Thus, an n$^+$ Si layer 32 which forms a silicon control electrode base layer 13 is maintained. Subsequently, a control electrode oxide film 35 whose head is exposed is etched, to form a gate opening portion.

In the next, platinum is plated with the n$^+$ Si layer 32 used as a base electrode, and the platinum control electrode 14 is formed. Through this plating step, the shape of the surface of the control electrode is smoothened, and small projections and edges are removed from the structure.

Subsequently, Mo is prepared as an anode 16, and this anode is layered with an anode-control electrode insulating spacer 15 inserted thereunder, thereby to attain a structure shown in FIG. 5.

(Second Embodiment)

Figure 8:
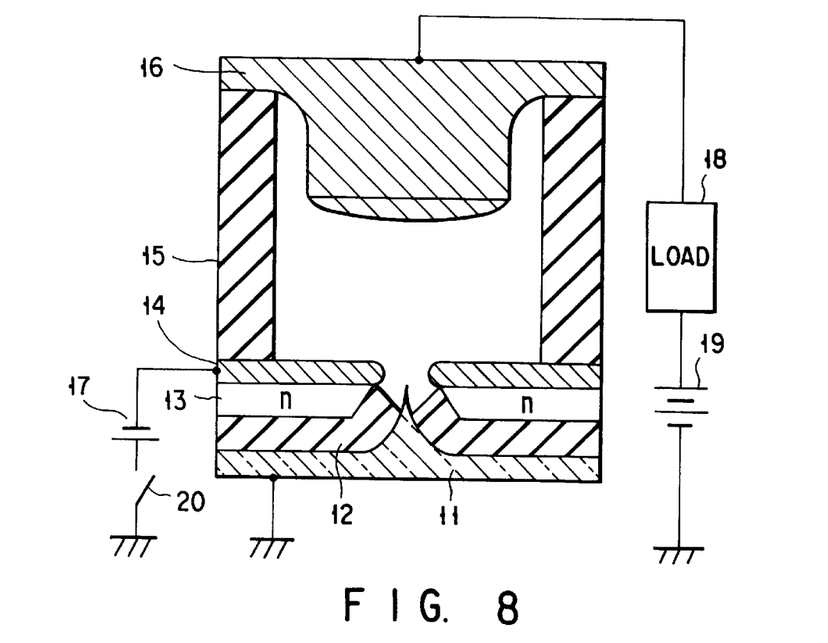
FIG. 8 is a view showing an element structure and a driving circuit of a micro power switch according to a second embodiment of the present invention.

FIG. 8 is a view showing an element structure and a driving circuit of a micro power switch according to a second embodiment of the present invention. Note that those portions which are the same as those shown in FIG. 5 are denoted by same reference symbols and detailed explanation of those portions will be omitted herefrom.

The present embodiment is different from the first embodiment in that a part of the anode 16 is formed to be a convex in the cold cathode side. Specifically, a convex portion is formed in the side of the anode 16 which is opposed to the cold cathode 11, and therefore, the minimum distance between the anode and the control electrode is smaller than the thickness of the insulating spacer layer 15.

In the structure as described above, the thickness of the insulating spacer layer 15 is longer than the minimum distance between the anode and the control electrode, and it is therefore possible to prevent insulating break-down at the spacer layer 15 which is applied with a voltage between the anode and the control electrode.

$Al_2O_3$, $MgF_2$, $SiO_2$, $TiO_2$ is preferably used as the insulating spacer layer 15. In addition, in actual operation, it is effective to repeatedly apply a voltage of about 70 to 80% of the insulating break-down voltage, thereby to flash over the surface of the control electrode.

As a result of this, small projections on the surface of the electrode are spattered so that electric field concentration points can be reduced.

(Third Embodiment)

Figure 9:
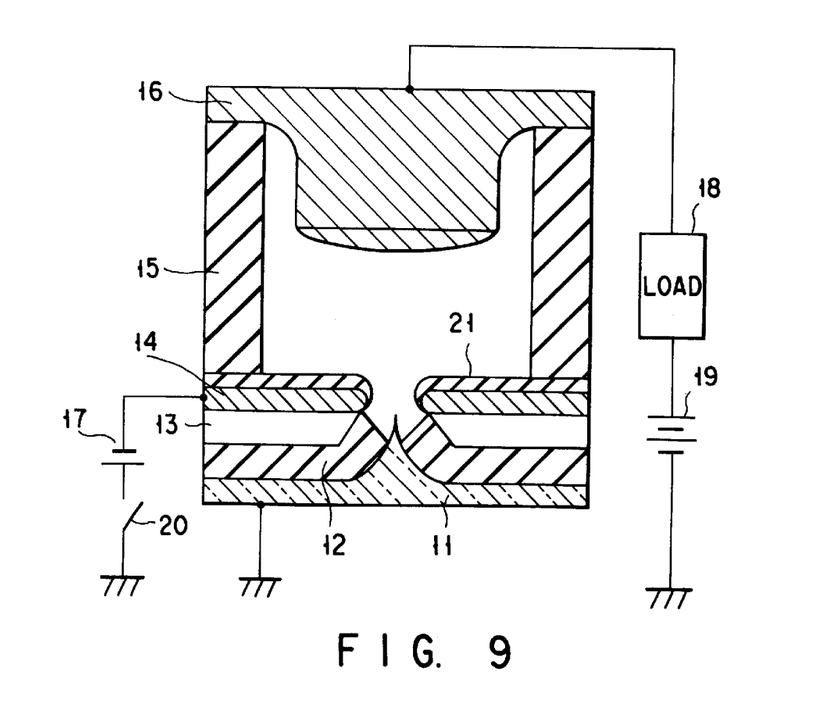
FIG. 9 is a view showing an element structure and a driving circuit of a cold cathode ray tube according to a third embodiment of the present invention.

FIG. 9 shows an element structure and a driving circuit of the micro power switch according to a third embodiment of the present invention. Note that those portions which are the same as those shown in FIG. 5 are denoted by same reference symbols and detailed explanation of those portions will be omitted herefrom.

The present embodiment adopts the structure of the micro power switch according to the second embodiment and is further arranged such that an insulating cover layer 21 covers the surface of the platinum control electrode 14, and in particular, the anode side of the electrode 14. This insulating cover layer 21 may be an electron emission barrier, and for example, $Al_2O_3$, $MgF_2$, $SiO_2$, or $TiO_2$ may be used as the insulating cover layer 21.

By this arrangement, electron emission from the surface of the control electrode can further be restricted and the withstanding voltage can be improved much more.

(Fourth Embodiment)

Figure 10:
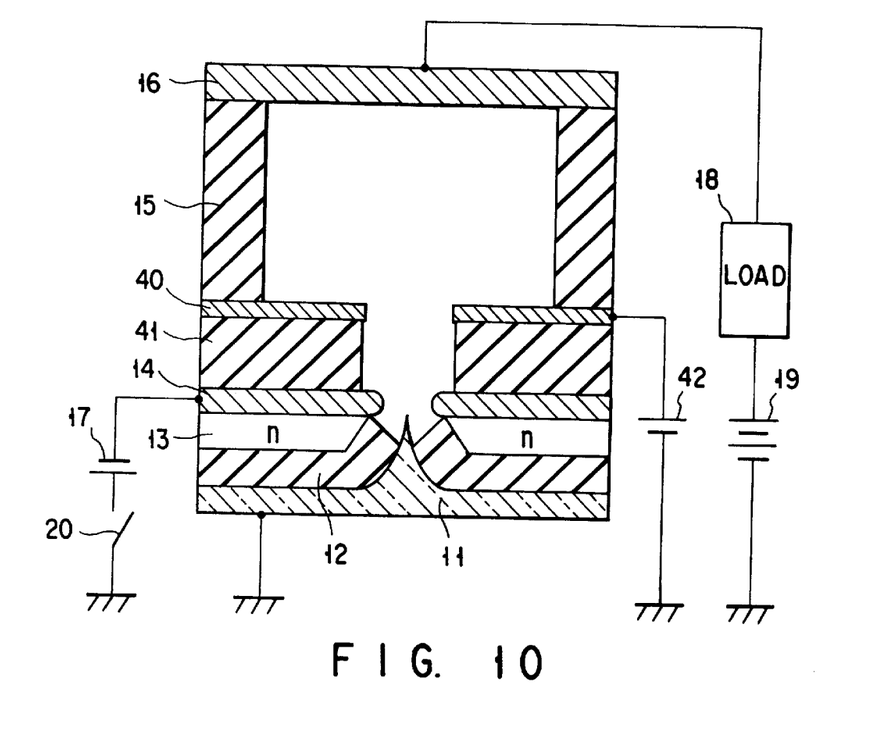
FIG. 10 is a view showing an element structure and a driving circuit of a micro power switch according to a fourth embodiment of the present invention.

FIG. 10 schematically shows an element structure and a driving circuit of a micro power switch according to a fourth embodiment of the present invention. Note that those portions which are the same as those shown in FIG. 5 are denoted by same reference symbols and detailed explanation thereof will be omitted herefrom.

This embodiment is different from the first embodiment in that an inducing electrode 40 is provided between a control electrode 14 and an anode 16. Specifically, an inducing electrode 40 is formed on a control electrode 14 with an insulating spacer layer 41 made of a silicon oxide film being inserted therebetween, and an anode 16 is formed on the electrode 40 with the insulating spacer 15 inserted therebetween.

Further, the inducing electrode 40 is arranged such that a positive voltage is applied to a cold cathode 11 from a power source 42.

The manufacturing method is basically the same as that of the first embodiment. That is, steps to be carried out until a control electrode 14 is formed are just the same as those of the first embodiment, and thereafter, an oxide silicon film is formed as an insulating spacer layer 41. Further, Mo is deposited as an inducing electrode 40, and this electrode is subjected to patterning by photolithography, thereby exposing the emitter opening. In subsequent steps, an insulating spacer layer 15 and an anode 16 are layered and subjected to vacuum enclosure, thereby to obtain a structure shown in FIG. 10.

Figure 11:
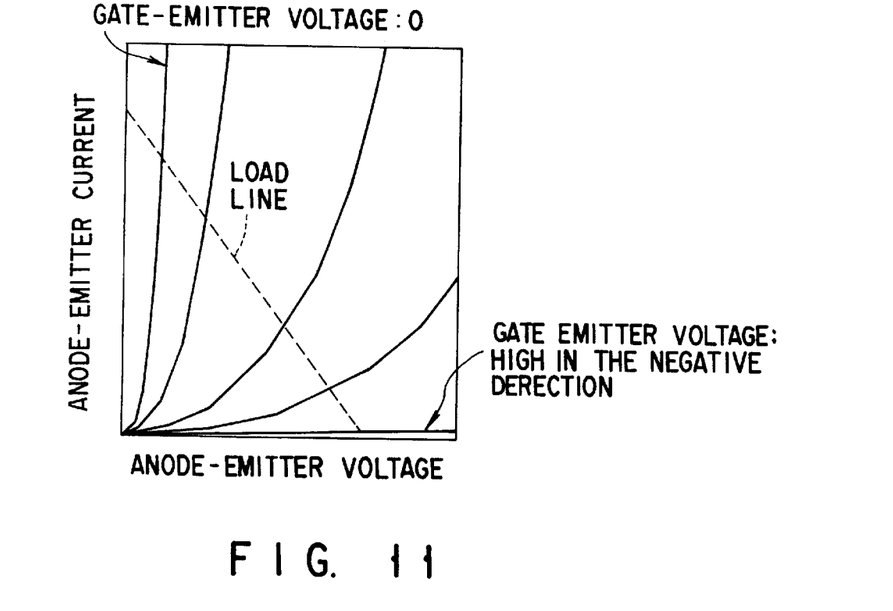
FIG. 11 is a graph showing current-voltage characteristics of a micro power switch according to the fourth embodiment of the present invention.

FIG. 11 shows operating characteristics of the element when power sources 17, 19, and 42 are connected as shown in FIG. 10 and the cold cathode is driven. FIG. 11 is a current-voltage characteristic graph showing changes in the current between the anode and the emitter with respect to the voltage between the anode and the emitter, in the element according to the present embodiment.

As shown in this figure, a voltage is applied between the anode and the cold cathode without applying a voltage to the control electrode 14. Then, a current rapidly flows from the anode 16 as the applied voltage increases.

Meanwhile, when a negative voltage is applied to the control electrode 14, the current decreases as the voltage increases in the negative direction, and finally, no current flows. When the element is used as a switching element, a voltage is not applied to the control electrode 14 to turn on the circuit while the negative voltage is applied thereto to turn off the circuit.

In addition, as is apparent from comparison with the current-voltage characteristic of an element without an inducing electrode as shown in FIG. 6, an anode voltage necessary for starting electron emission can be reduced if a positive voltage is applied to a cold cathode 11 while an inducing electrode 40 is provided so as not to shield the electric field of the anode 16. Thus, a much lower On-voltage can be realized.

Specifically, setting is arranged such that the electric field on the cold cathode chip surface is slightly smaller than the threshold electric field necessary for electron emission when a voltage is applied only with an inducing electrode 40 without applying an anode voltage. By arranging this setting, material which has a higher electric field electron emission threshold electric field can be used as cold cathode material.

Thus, according to the present embodiment, it is possible to realize a switching element which maintains a sufficiently low threshold voltage, has a high withstanding voltage and an extremely low loss, and achieves a large current capacity, like in the first embodiment. In addition, since an inducing electrode 40 is provided, a much lower voltage can be realized.

(Fifth Embodiment)

Figure 12:
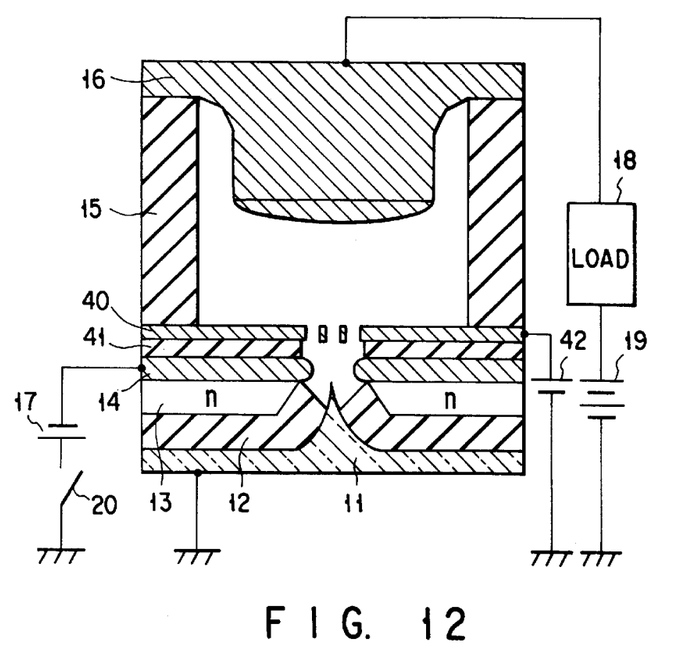
FIG. 12 is a view showing an element structure and a driving circuit of a micro power switch according to a fifth embodiment of the present invention.

FIG. 12 schematically shows an element structure and a driving circuit of a micro power switch according to a fifth embodiment of the present invention. Note that those portions which the same as those shown in FIG. 10 are denoted by same reference symbols and detailed explanation of those portions will be omitted herefrom.

The present embodiment is different from he fourth embodiment in that a part of the anode 16 is formed to be convex in the cold cathode side. Specifically, a convex portion is formed in the side of the anode 16 which opposes the cold cathode 11, and therefore, the minimum distance between the anode and the control electrode is shorter than the thickness of the insulating spacer layer 15.

In the structure thus constructed, since the thickness of the insulating spacer layer 15 is longer than the minimum distance between the anode and the control electrode, it is possible to prevent insulating break-down at the spacer layer 15 which receives the voltage between the anode and the control electrode.

In addition, $Al_2O_3$, $MgF_2$, $SiO_2$, and $TiO_2$ are preferable as material of the insulating spacer layer 15. In actual operation, it is effective to previously apply a voltage of about 70 to 80% of the insulating bread-down voltage, repeatedly, to flash over the control electrode surface. In this manner, small projections on the electrode surface are spattered or so, and electric field concentration points can be reduced.

In addition, by arranging the inducing electrode 40 to be like a grid on the cold cathode 11, the inducing effect of emitting electrons in the vertical direction is improved. In this case, it should be noted that the electric field shielding effect of the anode 16 is simultaneously traded off.

(Sixth Embodiment)

Figure 13:
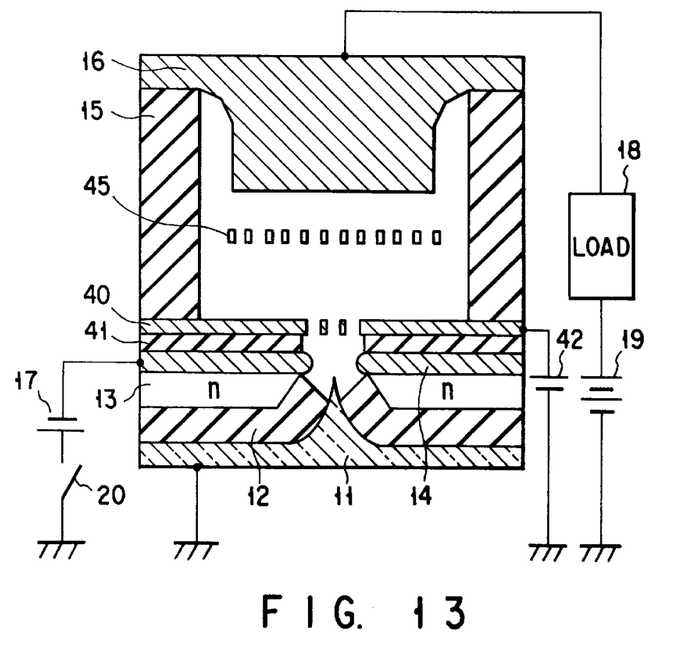
FIG. 13 is a view showing an element structure and a driving circuit of a micro power switch according to a sixth embodiment of the present invention.

FIG. 13 shows an element structure and a driving circuit of a micro power switch according to a sixth embodiment of the present invention. Note that those portions which are the same as those shown in FIG. 10 are denoted by same reference symbols and detailed explanation will be omitted herefrom.

The present embodiment is constructed by additionally providing an intermediate electrode 45 between an inducing electrode 40 and an anode 16 in the fifth embodiment described above. When the element is switched, electrons having a high energy collide into the anode 16, thereby emitting secondary electrons from the anode surfaces.

The secondary electrons may return to the inducing electrode 40 and may change the current-voltage characteristics. Return of these electrons is reduced by applying an appropriate potential (which is, for example, slightly positive with respect to the anode) to the intermediate electrode 45. As a result, changes in characteristics caused by return of secondary electrons can be reduced.

Note that the present invention is not limited to the embodiments described above. Diamond is used as cold cathode material in the above embodiments. However, the cold cathode material is not limited to diamond, but any material which has a smaller electron emission barrier than a control electrode can be used as the cold cathode material.

Specifically, it is possible to use carbon-based material having an $SP^3$ bond (e.g., diamond or diamond-like carbon), amorphous carbon, carbon-nano-tube (where each of amorphous carbon and carbon-nano-tube does not always include an SP$^3$ bond), GaN, BN (where GaN and BN have a low electron affinity), or metal having a low work function such as material containing GaN and/or BN, etc. In addition, the control electrode needs not be formed in two-layer structure, but may a single layer structure made of semiconductor having a larger electron affinity than a cold cathode or metal having a larger work function than a cold cathode.

The above embodiments have been explained with respect to a case in which the surface of a control electrode is covered with platinum. However, the surface of the control electrode may be covered with chrome, tungsten, niobium, tungsten-carbide, or the like in place of platinum. Further, the present invention can be variously modified in practical use, without deriving from the scope of the invention.

The element of the present invention is capable of substantially linearly increasing the insulating withstanding voltage, by increasing the distance to the anode. In this respect, the element of the present invention is different from a semiconductor element made of Si or the like. This characterizing feature can realize a high voltage switching device (or an insulating breaker or the like) which is much smaller in size than a conventional device.

Specifically, a high withstanding voltage can be maintained with layers much less than in the prior art technique in which elements such as thyristors which are layered in a number of layers to maintain a withstanding voltage in the prior art technique. Therefore, cooling can be easily achieved, and a device having an extremely small size can be realized. For example, a conventional device uses 4 kV-rated thyristors layered in 180 layers connected in series, in order to cut off a power supply line of 500 kV. However, the same power supply line can principally be cut off with only one single layer, according to the present invention.

Further, the present invention can be variously modified in practice without deriving from the scope of the present invention.

As has been described above, according to the present invention, it is possible to solve the problem of the constant current characteristic or a loss of a current to the control electrode, which is caused when a conventional cold cathode ray tube is applied to a switching element, and to realize a current-voltage characteristic that a current flows in correspondence with a voltage of a main circuit required for a switching element.

Further, in this case, both a sufficiently low ON-voltage and a high withstanding voltage can be attained. In addition, a large current capacity can be maintained. From above, it is possible to realize an excellent switching element having a high withstanding voltage, a low loss, and a large current capacity.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A micro power switch comprising:
    a cold cathode for emitting electrons;
    an anode for capturing the electrons emitted from the cold cathode, the anode being opposed to the cold cathode; and
    a control electrode, provided near the cold cathode, for controlling an amount of the electrons emitted from the cold cathode,
    wherein the cold cathode is made of material having a smaller electron emission barrier than the control electrode, the anode is applied with a positive potential with respect to the cold cathode, and the control electrode is applied with a varying potential equal to or lower than a potential of the cold cathode; and
    wherein in the case where the electron emission from the cold cathode is stopped, the varying potential is lower than the potential of the cold cathode.

2. The micro power switch according to claim 1, wherein the control electrode is made of Si, and the cold cathode is made of one of carbon-based material having an SP$^3$ bond, amorphous carbon, carbon-nano tube, GaN, BN, and material containing any of carbon-based material having an SP$^3$ bond, amorphous carbon, carbon-nano tube, GaN, and BN.

3. The micro power switch according to claim 1, wherein at least a part of a surface of the control electrode is covered with one of platinum, chrome, tungsten, niobium, and tungsten-carbide.

4. The micro power switch according to claim 1, wherein at least a part of a surface of the control electrode is covered with an insulating layer as a barrier for preventing electrons from being emitted.

5. The micro power switch according to claim 1, further comprising an insulating layer provided between the anode and the control electrode,
    wherein a distance between a top of the cold cathode and the anode is shorter than a length of the insulating layer.

6. The micro power switch according to claim 4, wherein the insulating layer is one of $Al_2O_3$, $MgF_2$, $SiO_2$, and $TiO_2$.

7. The micro power switch according to claim 1, further comprising an inducing electrode provided between the control electrode and the anode and applied with a positive potential in relation to the cold cathode.

8. The micro power switch according to claim 7, wherein the inducing electrode is formed like a grid.

9. The micro power switch according to claim 5, further comprising an inducing electrode provided between the control electrode and the anode and applied with a positive potential in relation to the cold cathode.

10. The micro power switch according to claim 9, wherein the inducing electrode is formed like a grid.

11. The micro power switch according to claim 7, further comprising an intermediate electrode provided between the inducing electrode and the anode and applied with a positive potential in relation to the anode.

12. The micro power switch according to claim 9, further comprising an intermediate electrode provided between the inducing electrode and the anode and applied with a positive potential in relation to the anode.

13. The micro power switch according to claim 1, wherein the anode is made of Mo.

14. The micro power switch according to claim 1, wherein the cold cathode is formed by a transfer mold method.

15. The micro power switch according to claim 1, wherein a potential between the anode and the cold cathode when the micro power switch is rendered electrically conductive is ½ or less of a potential between the anode and the cold cathode when the micro power switch is shut off.

16. A driving method for a micro power switch comprising as cold cathode for emitting electrons, an anode for capturing the electrons emitted from the cold cathode, the anode being opposed to the cold cathode; a control electrode, provided near the cold cathode, for controlling an amount of the electrons emitted from the cold cathode, wherein the cold cathode is made of material having a smaller electron emission barrier than the control electrode, the anode is applied with a positive potential with respect to the cold cathode, comprising steps of:

applying, to the anode, a potential necessary for drawing the electrons from the cold cathode; and applying, to the control electrode, a varying potential equal to or lower than a potential of the cold cathode; wherein in order to prevent the electrons from being emitted from the cold cathode, the varying potential is lower than the potential of the cold cathode.

17. A driving method for a micro power switch comprising as cold cathode for emitting electrons, an anode for capturing the electrons emitted from the cold cathode, the anode being opposed to the cold cathode; a control electrode, provided near the cold cathode, for controlling an amount of the electrons emitted from the cold cathode, and an insulating layer provided between the anode and the control electrode, wherein the cold cathode is made of material having a smaller electron emission barrier than the control electrode, and a distance between a top of the cold cathode and the anode is shorter than a length of the insulating layer, comprising steps of:

applying, to the anode, a potential necessary for drawing the electrons from the cold cathode; and applying, to the control electrode, a varying potential equal to or lower than a potential of the cold cathode; wherein in order to prevent the electrons from being emitted from the cold cathode, the varying potential is lower than the potential of the cold cathode.

18. A driving method for a micro power switch comprising as cold cathode for emitting electrons, an anode for capturing the electrons emitted from the cold cathode, the anode being opposed to the cold cathode; a control electrode, provided near the cold cathode, for controlling an amount of the electrons emitted from the cold cathode, an inducing electrode provided between the control electrode and the anode and applied with a positive potential in relation to the cold cathode, and an intermediate electrode provided between the inducing electrode and the anode and applied with a positive potential in relation to the anode, wherein the cold cathode is made of material having a smaller electron emission barrier than the control electrode, comprising steps of:

applying, to the anode, a potential necessary for drawing the electrons from the cold cathode; and applying, to the control electrode, a varying potential equal to or lower than a potential of the cold cathode; wherein in order to prevent the electrons from being emitted from the cold cathode, the varying potential is lower than the potential of the cold cathode.

19. A micro power switch comprising:

a cold cathode for emitting electrons;

an anode for capturing the electrons emitted from the cold cathode, the anode being opposed to the cold cathode; and a control electrode, provided near the cold cathode, for controlling an amount of the electrons emitted from the cold cathode, wherein the control electrode is applied with a varying potential equal to or lower than a potential of the cold cathode; and wherein in the case where the micro power switch is in an off state the varying potential is lower than the potential of the cold cathode.

20. The micro power switch according to claim 19, wherein the control electrode is applied with a potential lower than a zero potential in case where the micro power switch is in the off state.

21. The micro power switch according to claim 19, wherein the control electrode is non-biased in case where the micro power switch is in an on state.

22. The micro power switch according to claim 19, wherein the cold cathode is made of one of carbon-based material having an $SP^3$ bond, amorphous carbon, carbon-nano tube, GaN, BN, and material containing any of carbon-based material having an $SP^3$ bond, amorphous carbon, carbon-nano tube, GaN, and BN.

23. The micro power switch according to claim 19, wherein the cold cathode is made of material having a smaller electron emission barrier than the control electrode.

24. The micro power switch according to claim 19, wherein a potential between the anode and the cold cathode when the micro power switch is on state is ½ or less of a potential between the anode and the cold cathode when the micro power switch is in the off state.

25. A micro power switch comprising:

a cold cathode for emitting electrons;

an anode for capturing the electrons emitted from the cold cathode, the anode being opposed to the cold cathode; and a control electrode, provided near the cold cathode, for controlling an amount of the electrons emitted from the cold cathode, wherein the control electrode is applied with a varying potential equal to or lower than a potential of the cold cathode;

in the case where the micro power switch is in an off state, the varying potential is lower than the potential of the cold cathode; and the cold cathode is made of one of carbon-based material having an $SP^3$ bond, amorphous carbon, carbon-nano tube, GaN, BN, and material containing any of a carbon-based material having an $SP^3$ bond, amorphous carbon, carbon-nano tube, GaN, BN.

26. The micro power switch according to claim 25, wherein the control electrode is non-biased in case where the micro power switch is in an on state.

27. The micro power switch according to claim 25, wherein the cold cathode is made of material having a smaller electron emission barrier than the control electrode.

28. The micro power switch according to claim 25, wherein a potential between the anode and the cold cathode when the micro power switch is on state is ½ or less of a potential between the anode and the cold cathode when the micro power switch is in the off state.

29. The micro power switch according to claim 26, wherein the cold cathode is made of material having a smaller electron emission barrier than the control electrode.

30. The micro power switch according to claim 26, wherein a potential between the anode and the cold cathode when the micro power switch is on state is ½ or less of a potential between the anode and the cold cathode when the micro power switch is in the off state.

* * * * *